(12) United States Patent
Mahoney et al.

(10) Patent No.: US 11,834,535 B2
(45) Date of Patent: Dec. 5, 2023

(54) CURABLE HIGH REFRACTIVE INDEX COMPOSITIONS AND ARTICLES PREPARED FROM THEM

(71) Applicant: 3M INNOVATIVE PROPERTIES COMPANY, St. Paul, MN (US)

(72) Inventors: Wayne S. Mahoney, St. Paul, MN (US); Saswata Chakraborty, Cottage Grove, MN (US); Evan L. Schwartz, Vadnais Heights, MN (US); Claire Hartmann-Thompson, Lake Elmo, MN (US); Tabitha A. Silliman, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 589 days.

(21) Appl. No.: 17/054,655

(22) PCT Filed: May 10, 2019

(86) PCT No.: PCT/IB2019/053880
§ 371 (c)(1),
(2) Date: Nov. 11, 2020

(87) PCT Pub. No.: WO2019/220288
PCT Pub. Date: Nov. 21, 2019

(65) Prior Publication Data
US 2021/0061935 A1    Mar. 4, 2021

Related U.S. Application Data

(60) Provisional application No. 62/671,555, filed on May 15, 2018.

(51) Int. Cl.
| | | |
|---|---|---|
| *H01L 29/08* | (2006.01) | |
| *C08F 220/38* | (2006.01) | |
| *C09D 4/00* | (2006.01) | |
| *C09D 5/00* | (2006.01) | |
| *C09D 133/14* | (2006.01) | |

(Continued)

(52) U.S. Cl.
CPC ............ *C08F 220/38* (2013.01); *C09D 4/00* (2013.01); *C09D 5/002* (2013.01); *C09D 133/14* (2013.01);
(Continued)

(58) Field of Classification Search
CPC ...... C08F 220/38; C08F 2800/20; C08F 2/44; C08F 2/50; C08F 292/00; C08F 2/48; C08F 220/18; C08F 220/06; C08F 222/103; C08F 290/06; C08F 220/10; C08F 220/20; C08F 220/1811; C08F 222/102; C08F 290/14; C08F 2438/01; C08F 2/38; C08F 20/10; C08F 230/08; C08F 265/06; C08F 220/1808; C08F 290/067; C08F 20/26; C08F 30/08; C08F 220/14; C08F 220/325; C08F 220/1802; C08F 222/104; C08F 2438/00; C08F 290/062; C08F 212/08; C08F 220/34; C08F 283/12; C08F 2/00; C08F 230/085; C08F 290/061; C08F 2/34; C08F 220/22; C08F 212/36; C08F 220/1807; C08F 220/282; C08F 2/54; C08F 220/16; C08F 220/302; C08F 4/00; C08F 20/18; H10K 50/858; H10K 71/00; H10K 50/00; C09D 5/002; C09D 133/14; G02B 1/04; H01L 31/0232; H01L 2224/13; H01L 2224/13099; H01L 2224/13111; H01L 2224/13144; H01L 2224/13147; H01L 2224/16227; H01L 2224/81191; H01L 2224/81193; H01L 2224/81815;
(Continued)

(56) References Cited

U.S. PATENT DOCUMENTS

| | | |
|---|---|---|
| 5,574,163 A | 11/1996 | Luzzi |
| 9,383,482 B2 | 7/2016 | Walker, Jr. |
| 2015/0349295 A1 | 12/2015 | Boesch |

FOREIGN PATENT DOCUMENTS

| | | |
|---|---|---|
| KR | 10-2012-0040799 | 4/2012 |
| KR | 101254325 | 4/2013 |
| WO | WO 2018-122748 | 7/2018 |

OTHER PUBLICATIONS

Naoya Nishimura et al.: "High Refractive Coating Materials Using Hyperbranched Polymers", Journal of Photopolymer Science and Technology, vol. 25, No. 3, Jan. 1, 2012, p. 355-358, XP055171307, ISSN: 0914-09244, DOI: 10.2494/photopolymer.25.355 (Year: 2012).*

(Continued)

*Primary Examiner* — Niki H Nguyen
(74) *Attorney, Agent, or Firm* — Jeffrey M. Olofson

(57) ABSTRACT

Curable compositions include an acrylate of Formula I: Formula I at least one multifunctional (meth)acrylate with fused aromatic groups, heteroarylene groups, heteroalkylene groups, alkylene groups, or aralkylene groups, and a photoinitiator. The compositions, when cured, have a refractive index of 1.63 or greater at 532 nanometers, are optically transparent, and have a thermal stability such that upon heating for 1 hour at 250° C. they have a weight loss of 3.5% or less.

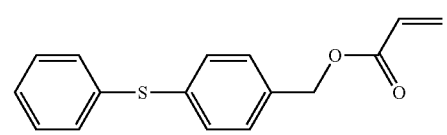

I

19 Claims, No Drawings

(51) Int. Cl.
    *H10K 50/858* (2023.01)
    *H10K 71/00* (2023.01)
    *G02B 1/04* (2006.01)

(52) U.S. Cl.
    CPC ........... *H10K 50/858* (2023.02); *H10K 71/00* (2023.02); *C08F 2800/20* (2013.01); *G02B 1/04* (2013.01)

(58) Field of Classification Search
    CPC ......... H01L 24/13; H01L 24/16; H01L 24/81; H01L 24/83
    See application file for complete search history.

(56) References Cited

OTHER PUBLICATIONS

KR 101 254 325 B1 (Hannong Chemincals Inc [KR]) Apr. 12, 2013 (Apr. 12, 2013) (Year: 2013).*

Kim, "Preparation of UV-curable acryl resin for high refractive index based on 1,5-bis(2-acryloylenethyl)-3.4-ethylenedithiothiophene", European Polymer Journal, Dec. 2015 vol. 75, pp. 303-309.

Lu, "Improved external coupling efficiency in organic light-Emitting devices on high-index substrates", International Electron Devices Meeting 2000. Technical Digest. IEDM (Cat. No.00CH37138), Dec. 2000, pp. 607-610.

Nishimura, "High Refractive Coating Materials Using Polymers Coating Materials Using Polymers", Journal Of Photopolymer Science And Technology, Jan. 2012, vol. 25, No. 3, pp. 355-358.

Saxena, "A review on the light extraction techniques in organic electroluminescent devices", Optical Materials, Nov. 2009, vol. 32, No. 1, pp. 221-233.

You, "Highly refractive polymer resin derived from sulfur-containing aromatic acrylate", Journal of Polymer Science: Part A: Polymer Chemistry, Jun. 2010, vol. 48, No. 12, pp. 2604-2609.

International Search Report for PCT International Application No. PCT/IB2019/053880, dated Nov. 7, 2019, 7 pages.

* cited by examiner

CURABLE HIGH REFRACTIVE INDEX COMPOSITIONS AND ARTICLES PREPARED FROM THEM

FIELD OF THE DISCLOSURE

This disclosure relates to curable compositions that have a high refractive index relative to typical polymeric compositions, and can be cured to form articles.

BACKGROUND

Increasingly, optical devices are becoming more complicated and involve more and more functional layers. As light travels through the layers of the optical device, the light can be altered by the layers in a wide variety of ways. For example, light can be reflected, refracted or absorbed. In many cases, layers that are included in optical devices for non-optical reasons adversely affect the optical properties. For example, if a support layer is included that is not optically clear, the absorption of light by the non-optically clear support layer can adversely affect the light transmission of the entire device.

One common difficulty with multi-layer optical devices is that when layers of differing refractive indices are adjacent to each other, refraction of light can occur at their interface. In some devices this refraction of light is desirable, but in other devices the refraction is undesirable. In order to minimize or eliminate this refraction of light at the interface between two layers, efforts have been made to minimize the difference in refractive index between the two layers that form the interface. However, as a wider range of materials have been employed within optical devices, the matching of refractive indices has become increasingly difficult. Organic polymer films and coatings, which are frequently used in optical devices, have a limited range of refractive indices. As higher refractive index materials are increasingly used in optical devices, it has become increasingly difficult to prepare organic polymeric compositions which have suitable optical properties, such as desirable refractive indices and optical clarity, and yet retain the desirable features of organic polymers, such as ease of processing, flexibility, and the like.

SUMMARY

This disclosure relates to curable compositions that have a high refractive index relative to typical organic polymeric compositions, articles containing cured layers of these curable compositions, and methods of forming articles.

In some embodiments, the curable compositions comprise an acrylate of Formula I,

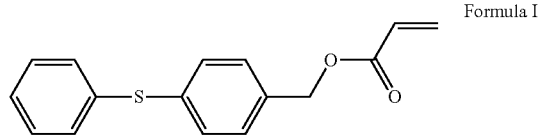 [SMILES: C=CC(=O)OCc1ccc(Sc2ccccc2)cc1]

Formula I at least one multifunctional (meth)acrylate where the multifunctional (meth)acrylate comprises fused aromatic groups, heteroarylene groups, heteroalkylene groups, alkylene groups, or aralkylene groups, and the composition also comprises a photoinitiator. The composition, when cured, has a refractive index of 1.63 or greater at 532 nanometers, is optically transparent, and has a thermal stability such that upon heating for 1 hour at 250° C. has a weight loss of 3.5% or less.

Also disclosed are articles. In some embodiments, the articles comprise a substrate with a first major surface and a second major surface, a cured organic layer adjacent to at least a portion of the second major surface of the substrate. The cured organic layer comprises a crosslinked (meth)acrylate-based layer, and has a refractive index of 1.63 or greater at 532 nanometers, is optically transparent, and has a thermal stability such that upon heating for 1 hour at 250° C. has a weight loss of 3.5% or less.

Methods of preparing articles are also disclosed. In some embodiments, the method of preparing an article comprises providing a substrate with a first major surface and a second major surface, providing a curable composition, disposing the curable composition on at least a portion of the second major surface of the substrate to form a curable layer, curing the curable layer to form a cured organic layer. The curable composition comprises an acrylate of Formula I;

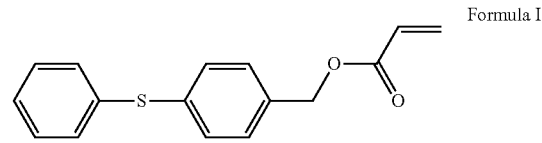 [SMILES: C=CC(=O)OCc1ccc(Sc2ccccc2)cc1]

Formula I at least one multifunctional (meth)acrylate where the multifunctional (meth)acrylate comprises fused aromatic groups, heteroarylene groups, heteroalkylene groups, alkylene groups, or aralkylene groups, and the composition also comprises a photoinitiator. The curable composition when disposed and cured has a refractive index of 1.63 or greater at 532 nanometers, is optically transparent, and has a thermal stability such that upon heating for 1 hour at 250° C. has a weight loss of 3.5% or less.

DETAILED DESCRIPTION

Optical devices are becoming more and more complex, which impacts the materials used in them. In particular, organic polymeric materials have found widespread use in optical devices, however, they still must meet the stringent requirements and demands needed for performance.

For example, thin organic polymeric films are desirable for a wide range of uses in optical devices, as adhesives, protective layers, spacer layers, and the like. As articles have become more complex, the physical demands upon these layers have increased. For example, as optical devices have become more compact, they often include additional layers, resulting in a growing need for thinner layers. At the same time, since the layers are thinner, the layers also need to be more precise. For example, a thin spacer layer (of 1 micrometer thickness) needs to be level and free of gaps and holes in order to provide the proper spacing function. This requires deposition of the organic layer in a precise and consistent manner.

Additionally, not only do these layers have to fulfill their physical role (adhesion, protection, spacing, and the like) they must also provide the requisite optical properties. Among the properties that are becoming increasingly important is refractive index. As light travels through the layers of a multilayer article, it encounters the interface between layers. If the refractive indices of the layers are different, light can be refracted. Therefore, to minimize this refraction, matching of the refractive indices of layers within a multilayer article is desirable.

Additionally, not only are organic polymer layers needed that have the optical properties described above, but also the organic polymer layers need to maintain their properties through a wide range of use conditions. In particular, the organic polymer layers should have high thermal stability, such that the organic polymer layers do not degrade over time or upon exposure to elevated temperatures.

An example of an optical device that utilizes thin film layers are OLED (organic light-emitting diode) devices. In particular, the organic light-emitting devices are susceptible to degradation from the permeation of certain liquids and gases, such as water vapor and oxygen. To reduce permeability to these liquids and gases, barrier layers are applied to the OLED device, which is known in the art as thin film encapsulation. Typically these barrier layers are inorganic layers with a high refractive index. Typically the inorganic barrier layer is not used alone, rather a barrier stack is used which can include multiple dyads. Dyads are two layer structures that include a barrier layer and decoupling layer. The decoupling layer provides a planarized and/or smooth surface for the deposition of the inorganic barrier layer.

Various materials and material compositions have been developed for use as high refractive index layers in optical devices. Each of these developments have advantages and drawbacks. For example, US Patent Publication No. 2015/0349295 (Boesch et al.) describes devices that utilize dyads as barrier coatings where the dyads include a first layer (decoupling layer) that is an organic-inorganic hybrid material and the second layer is an inorganic barrier layer. The organic-inorganic hybrid decoupling layer includes an organic matrix with either an organometallic polymer or inorganic nanoparticles such that the inorganic material raises the refractive index to better match the inorganic barrier layer refractive index.

Also, U.S. Ser. No. 62/439,973 filed on Dec. 29, 2016 describes curable ink compositions that have a high refractive index. The curable ink compositions described therein are reactive liquid mixtures that include mixtures of aromatic (meth)acrylates that are printable, by for example inkjet printing.

An issue that has not been addressed in the material compositions previously disclosed is the combination of curability, high refractive index, and high thermal stability. This desirable set of features is not achievable with the material combinations that have been described previously. Thus a need remains for curable materials to form organic polymer layers that have a high refractive index, are optically clear, and are thermally stable.

In this disclosure, curable compositions are described that have a number of traits that make them suitable for the formation of layers within multilayer optical devices. The compositions, when cured, have a relatively high refractive index of 1.63 or greater at 532 nanometers. The compositions also have high thermal stability, such that upon heating to a temperature of 250° C. for 1 hour has a weight low of 3.5% or less.

Also disclosed herein are articles, especially optical articles that comprise multiple layers of films, substrates and coatings. Among the articles of this disclosure are articles comprising a substrate, a cured organic layer adjacent to the substrate, and optionally an inorganic barrier layer disposed on the cured organic layer. The cured organic layer comprises a crosslinked (meth)acrylate-based layer that has a thickness of from 1-16 micrometers, and has a refractive index of 1.63 or greater at 532 nanometers, and is optically clear.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. For example, reference to "a layer" encompasses embodiments having one, two or more layers. As used in this specification and the appended claims, the term "or" is generally employed in its sense including "and/or" unless the content clearly dictates otherwise.

As used herein, the term "adjacent" refers to two layers that are proximate to another layer. Layers that are adjacent may be in direct contact with each other, or there may be an intervening layer. There is no empty space between layers that are adjacent.

Typically the curable compositions are described as "100% solids". As used herein, "100% solids" refers to curable ink compositions that do not contain volatile solvents and that all of the mass that is deposited on a surface remains there, no volatile mass is lost from the coating.

The terms "Tg" and "glass transition temperature" are used interchangeably. If measured, Tg values are determined by Differential Scanning Calorimetry (DSC) as described in the Examples section. While in general the Tg values for copolymers are measured in this disclosure, typically Tg values are not measured but are calculated using the well-known Fox Equation, using the Tg values provided by the monomer supplier for homopolymers prepared from those monomers, as is understood by one of skill in the art.

The terms "room temperature" and "ambient temperature" are used interchangeably and have their conventional meaning, that is to say a temperature of from 20-25° C.

The term "organic" as used herein to refer to a cured layer, means that the layer is prepared from organic materials and is free of inorganic materials.

The term "(meth)acrylate" refers to monomeric acrylic or methacrylic esters of alcohols. Acrylate and methacrylate monomers or oligomers are referred to collectively herein as "(meth)acrylates". The term "(meth)acrylate-based" as used herein refers to a polymeric composition that comprises at least one (meth)acrylate monomer and may contain additional (meth)acrylate or non-(meth)acrylate co-polymerizable ethylenically unsaturated monomers. Polymers that are (meth)acrylate based comprise a majority (that is to say greater than 50% by weight) of (meth)acrylate monomers.

The terms "curing" and "cured" as used herein refers to compositions that are polymerized. Typically cured compositions described herein are crosslinked, but the terms curing and crosslinking are not synonymous.

The terms "free radically polymerizable" and "ethylenically unsaturated" are used interchangeably and refer to a reactive group which contains a carbon-carbon double bond which is able to be polymerized via a free radical polymerization mechanism.

The term "hydrocarbon group" as used herein refers to any monovalent group that contains primarily or exclusively carbon and hydrogen atoms. Alkyl and aryl groups are examples of hydrocarbon groups.

The term "alkyl" refers to a monovalent group that is a radical of an alkane, which is a saturated hydrocarbon. The alkyl can be linear, branched, cyclic, or combinations thereof and typically has 1 to 20 carbon atoms. In some embodiments, the alkyl group contains 1 to 18, 1 to 12, 1 to 10, 1 to 8, 1 to 6, or 1 to 4 carbon atoms. Examples of alkyl groups include, but are not limited to, methyl, ethyl, n-propyl, isopropyl, n-butyl, isobutyl, tert-butyl, n-pentyl, n-hexyl, cyclohexyl, n-heptyl, n-octyl, and ethylhexyl.

The term "aryl" refers to a monovalent group that is aromatic and carbocyclic. The aryl can have one to five rings that are connected to or fused to the aromatic ring. The other ring structures can be aromatic, non-aromatic, or combinations thereof. Examples of aryl groups include, but are not limited to, phenyl, biphenyl, terphenyl, anthryl, naphthyl, acenaphthyl, anthraquinonyl, phenanthryl, anthracenyl, pyrenyl, perylenyl, and fluorenyl.

The term "alkylene" refers to a divalent group that is a radical of an alkane. The alkylene can be straight-chained, branched, cyclic, or combinations thereof. The alkylene often has 1 to 20 carbon atoms. In some embodiments, the alkylene contains 1 to 18, 1 to 12, 1 to 10, 1 to 8, 1 to 6, or 1 to 4 carbon atoms. The radical centers of the alkylene can be on the same carbon atom (i.e., an alkylidene) or on different carbon atoms.

The term "heteroalkylene" refers to a divalent group that includes at least two alkylene groups connected by a thio, oxy, or —NR— where R is alkyl. The heteroalkylene can be linear, branched, cyclic, substituted with alkyl groups, or combinations thereof. Some heteroalkylenes are polyoxyalkylenes where the heteroatom is oxygen such as for example, —CH$_2$CH$_2$(OCH$_2$CH$_2$)$_n$OCH$_2$CH$_2$—.

The term "heteroaromatic" or "heteroaryl" are used interchangeably and as used herein refers to an aromatic ring that contains at least one heteroatom in the ring structure.

The term "arylene" refers to a divalent group that is carbocyclic and aromatic. The group has one to five rings that are connected, fused, or combinations thereof. The other rings can be aromatic, non-aromatic, or combinations thereof. In some embodiments, the arylene group has up to 5 rings, up to 4 rings, up to 3 rings, up to 2 rings, or one aromatic ring. For example, the arylene group can be phenylene.

The term "heteroarylene" refers to a divalent group that is carbocyclic and aromatic and contains heteroatoms such as sulfur, oxygen, nitrogen or halogens such as fluorine, chlorine, bromine or iodine.

The term "aralkylene" refers to a divalent group of formula —R$^a$—Ar$^a$— where R$^a$ is an alkylene and Ar$^a$ is an arylene or heteroarylene (i.e., an alkylene is bonded to an arylene or a heteroarylene).

Unless otherwise indicated, "optically transparent" refers to a layer, film, or article that has a high light transmittance over at least a portion of the visible light spectrum (about 400 to about 700 nm). Typically, optically transparent layers, films, or articles have a luminous transmission of at least 80%.

Unless otherwise indicated, "optically clear" refers to a layer, film, or article that has a high light transmittance over at least a portion of the visible light spectrum (about 400 to about 700 nm), and that exhibits low haze. Typically, optically clear layers, films, or articles have visible light transmittance values of at least 80%, often at least 90%, and haze values of 5% or less, often 2% or less. Luminous transmission and haze can be measured using techniques and equipment well known in the art.

Disclosed herein are curable compositions that are mixtures comprising an acrylate of Formula I below:

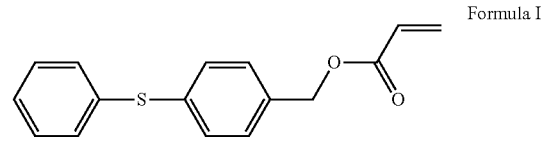

Formula I together with at least one multifunctional (meth)acrylate with fused aromatic groups, heteroarylene groups, heteroalkylene groups, alkylene groups, aralkylene groups, or combinations of these groups, and a photoinitiator. The compound of Formula I can be synthesized as described in the Examples section.

The curable compositions, when cured have wide variety or useful properties. Among these properties are optical properties as well as mechanical properties. The curable compositions, when cured, have a refractive index of 1.63 or greater at 532 nanometers, are optically transparent, and have a thermal stability such that upon heating for 1 hour at 250° C. has a weight loss of 3.5% or less. Optical properties and thermal stability can be measured by the techniques described in the Examples section. In some embodiments, the refractive index is at least 1.64, 1.65, 1.66, 1.67, 1.68, 1.69, or 1.70. In some embodiments, the curable compositions, when cured are optically clear.

A wide range of mixture compositions are suitable from preparing the curable compositions of this disclosure. Typically, the acrylate of Formula I is a majority component of curable composition, meaning that it is present in an amount of at least 50% by weight. The % by weight refers to the percentage of the total weight of the curable components of the curable composition. In some embodiments, the curable composition comprises greater than 50% by weight of the acrylate of Formula I. In some embodiments the amount of the acrylate of Formula I is greater than 60%, greater than 70%, greater than 75%, greater than 80%, up to 90% by weight, or even greater than 90%.

The curable composition also comprises at least one multifunctional (meth)acrylate with fused aromatic groups, heteroarylene groups, heteroalkylene groups, alkylene groups, or aralkylene groups. In some embodiments, the at least one multifunctional (meth)acrylate comprises 10% by weight or less of the curable composition.

A wide range of multifunctional (meth)acrylates are suitable for use in the curable compositions of this disclosure. In some embodiments, the multifunctional (meth)acrylate comprises a compound of Formula II:

H$_2$C=CR$_2$—(CO)—O-A-O—(CO)—R2C=CH$_2$   Formula II wherein R2 is hydrogen or a methyl group; (CO) is a carbonyl group C=O; and A is a divalent group comprising fused aromatic groups, heteroarylene groups, heteroalkylene groups, alkylene groups, aralkylene groups, or combinations thereof.

In some embodiments of the multifunctional (meth)acrylate of Formula II, the group A is a divalent group comprising a fused aromatic group selected from a fluorenyl group. In other embodiments, the group A has the general structure: -(L-O)$_m$—B—(O-L)$_m$- where B is a phenyl-substituted fluorenyl group, an alkylene-substituted fluorenyl group, a naphthalene group, or an —Ar—Ar— group, where each Ar group is a naphthalene group; L is an alkylene group comprising 2-12 carbon atoms; and m is an integer ranging from 1-10. Examples of such (meth)acrylates include those described by Formulas III, IV and V below:

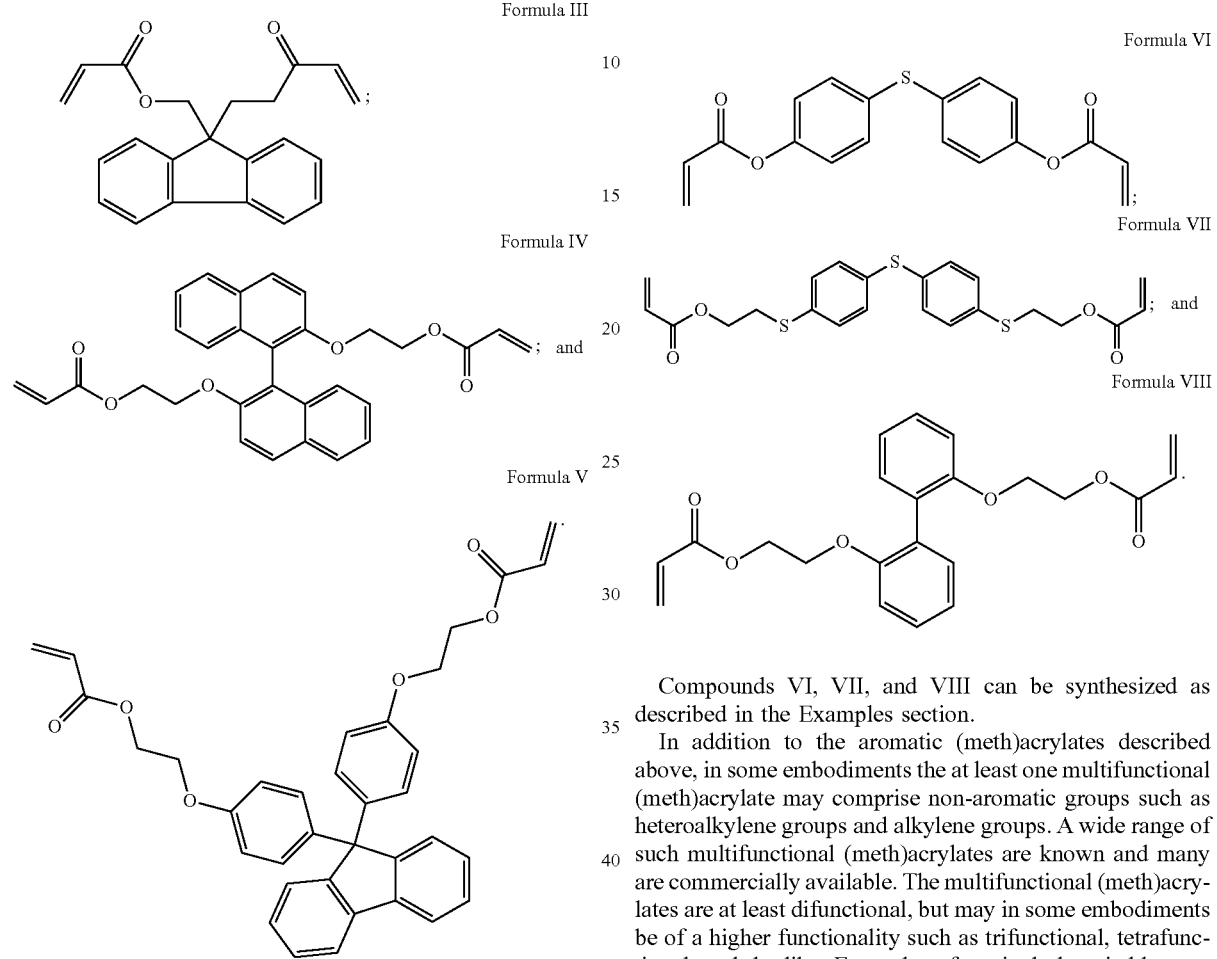

The compound of Formula III, fluorene diacrylate (FDA), can be synthesized as described in the Examples section. The compound of Formula IV, [1.1'-binaphthalene]-2.2'-diylbis(oxy)bid(ethane-2,1-diyl) diacrylate can be obtained as KAYARAD BNP-1 from Nippon Kayaku Co. Ltd. Tokyo, Japan. The compound of Formula V, ethoxylated bisphenol fluorene diacrylate (BPEFDA), is commercially available from KPX Green Chemical Co, Ltd., Seoul, Korea as a mixture of 60% BPEFDA and 40% ortho-phenylphenol (EO) acrylate (OPPEA), as KONOMER D0241.

In some embodiments, the multifunctional (meth)acrylate comprises a compound of Formula IIA below:

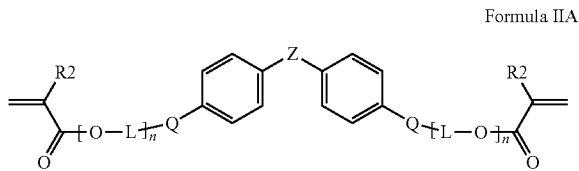

where each R2 is independently hydrogen or methyl; Z is S, or a single bond; each Q is independently O or S; L is an alkylene group comprising 2-12 carbon atoms; and n is an integer ranging from 0 to 10. Examples of such (meth)acrylates include those described by Formulas VI, VII and VIII below:

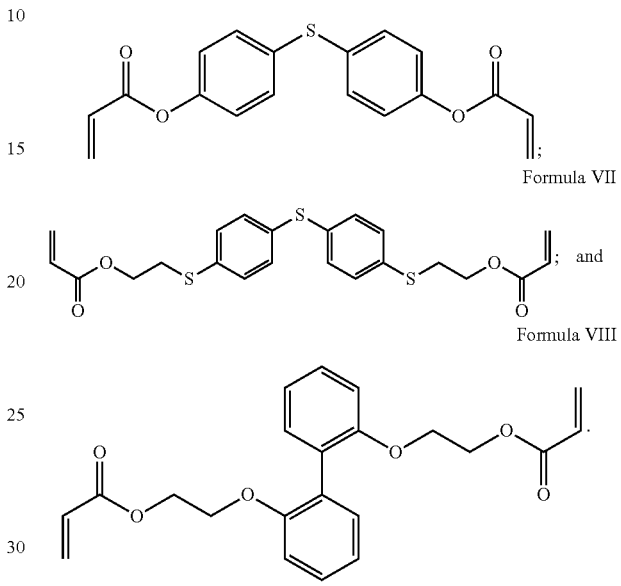

Compounds VI, VII, and VIII can be synthesized as described in the Examples section.

In addition to the aromatic (meth)acrylates described above, in some embodiments the at least one multifunctional (meth)acrylate may comprise non-aromatic groups such as heteroalkylene groups and alkylene groups. A wide range of such multifunctional (meth)acrylates are known and many are commercially available. The multifunctional (meth)acrylates are at least difunctional, but may in some embodiments be of a higher functionality such as trifunctional, tetrafunctional, and the like. Examples of particularly suitable non-aromatic multifunctional (meth)acrylates include those available from Sartomer such as: SR833S (tricyclodecane dimethanol diacrylate); SR351H (trimethylolpropane triacrylate); and SR454 (ethoxylated (3) trimethylolpropane triacrylate).

The curable composition also comprises at least one photoinitiator, meaning that the initiator is activated by light, generally ultraviolet (UV) light, although other light sources could be used with the appropriate choice of initiator, such a visible light initiators, infrared light initiators, and the like. Typically, UV photoinitiators are used.

Useful photoinitiators include those known as useful for photocuring free-radically polyfunctional (meth)acrylates. Exemplary photoinitiators include benzoin and its derivatives such as alpha-methylbenzoin; alpha-phenylbenzoin; alpha-allylbenzoin; alpha benzylbenzoin; benzoin ethers such as benzil dimethyl ketal (e.g., "OMNIRAD BDK" from IGM Resins USA Inc., St. Charles, IL), benzoin methyl ether, benzoin ethyl ether, benzoin n-butyl ether; acetophenone and its derivatives such as 2-hydroxy-2-methyl-1-phenyl-1-propanone (e.g., available under the trade designation OMNIRAD 1173 from IGM Resins USA Inc., St. Charles, IL) and 1-hydroxycyclohexyl phenyl ketone (e.g., available under the trade designation OMNIRAD 184 from IGM Resins USA Inc., St. Charles, IL); 2-methyl-1-[4-(methylthio)phenyl]-2-(4-morpholinyl)-1-propanone (e.g., available under the trade designation OMNIRAD 907 from IGM Resins USA Inc., St. Charles, IL); 2-benzyl-2-(dimethylamino)-1-[4-(4-morpholinyl)phenyl]-1-butanone (e.g., available under the trade designation OMNIRAD 369 from IGM Resins USA Inc., St. Charles, IL) and phosphine oxide derivatives such as ethyl-2,4,6-trimethylbenzoylphenyl phoshinate (e.g. available under the trade designation TPO-L from IGM Resins USA Inc., St. Charles, IL), and bis-(2,4, 6-trimethylbenzoyl)-phenylphosphineoxide (e.g., available under the trade designation OMNIRAD 819 from IGM Resins USA Inc., St. Charles, IL).

Other useful photoinitiators include, for example, pivaloin ethyl ether, anisoin ethyl ether, anthraquinones (e.g., anthraquinone, 2-ethylanthraquinone, 1-chloroanthraquinone, 1,4-dimethylanthraquinone, 1-methoxyanthraquinone, or benzanthraquinone), halomethyltriazines, benzophenone and its derivatives, iodonium salts and sulfonium salts, titanium complexes such as bis(eta5-2,4-cyclopentadien-1-yl)-bis[2,6-difluoro-3-(1H-pyrrol-1-yl) phenyl]titanium (e.g., available under the trade designation CGI 784DC from BASF, Florham Park, NJ); halomethyl-nitrobenzenes (e.g., 4-bromomethylnitrobenzene), and combinations of photoinitiators where one component is a mono- or bis-acylphosphine oxide (e.g., available under the trade designations IRGACURE 1700, IRGACURE 1800, and IRGACURE 1850 from BASF, Florham Park, NJ, and under the trade designation OMNIRAD 4265 from IGM Resins USA Inc., St. Charles, IL).

Generally the photoinitiator is used in amounts of 0.01 to 10 parts by weight, more typically 0.1 to 2.0, parts by weight relative to 100 parts by weight of total reactive components.

The curable composition may contain additional reactive or unreactive components, but such components are not necessary and should be used with care to ensure that they are not detrimental to the final properties of the formed (meth)acrylate-based polymer. The curable compositions may also contain polymerization inhibitors, light stabilizers (e.g. hindered amines), synergists, antioxidants, catalysts, dispersants, leveling agents, and the like as needed or desired. Typically, the curable compositions do not contain or require additional reactive or unreactive components, but such components can be used if desired.

This disclosure also comprises articles prepared from the curable compositions prepared above. Disclosed herein are articles comprising a substrate with a first major surface and a second major surface, and a cured organic layer adjacent to at least a portion of the second major surface of the substrate. The cured organic layer may be a continuous layer, a discontinuous layer. Additionally, the cured organic layer may be flat (i.e. unstructured), or may contain structural features that may be patterned or random, and may have a wide range of shapes such as lines, posts, pillars, hemispheres, pyramids, and the like. Examples of articles that have structured cured organic layers include, for example, lenses such as microlenses.

The cured organic layer comprises a crosslinked (meth)acrylate-based layer, and has a refractive index of 1.63 or greater at 532 nanometers, and is optically transparent, and has a thermal stability such that upon heating for 1 hour at 250° C. has a weight loss of 3.5% or less. In some embodiments, the refractive index is at least 1.64, 1.65, 1.66, 1.67, 1.68, 1.69, or 1.70. In some embodiments, the cured organic layer is optically clear.

A wide array of flexible and non-flexible substrates are suitable for use in the articles of this disclosure. For example, the substrate may be glass or a relatively thick layer of a polymeric material such as PMMA (polymethyl methacrylate) or PC (polycarbonate). Alternatively, the substrate may be a flexible polymeric film, such as films of PET (polyethylene terephthalate), PEN (polyethylene naphthalate), PC (polycarbonate), polyimide, PEEK (polyetherether ketone), and the like.

The articles can also include a wide range of additional substrates and layers. In some embodiments, the article further comprises an inorganic barrier layer in contact with the cured organic layer.

The cured organic layer comprises a curable composition that has been disposed and cured on at least a portion of the second major surface of the substrate. The curable compositions have been described above. The curable composition comprises an acrylate of Formula I;

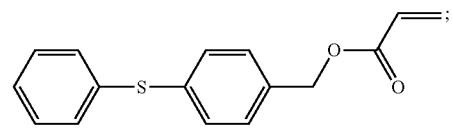

Formula I at least one multifunctional (meth)acrylate with fused aromatic groups, heteroarylene groups, heteroalkylene groups, alkylene groups, or aralkylene groups; and a photoinitiator.

The curable composition can be disposed on the second major surface of the substrate through a wide range of techniques. Methods of coating such as knife coating, gravure coating, air knife coating, slot die coating, and printing can be suitable. Printing techniques, such as screen printing and inkjet printing, are particularly suitable methods of disposing the curable composition on the second major surface of the substrate.

Typically, the cured organic layer is a relatively thin layer. Typically the cured organic layer is less than 1 mil thick (25 micrometers). In some embodiments, the cured organic layer has a thickness of from 1-16 micrometers.

Among the particularly desirable articles utilizing cured organic layers prepared from the curable compositions described above, are electronic and optical devices. In some embodiments, the articles of disclosure further comprise a device disposed on the second major surface of the substrate, and adjacent to the cured organic layer. A wide range of devices are suitable. An example of a particularly suitable application is an article, where the device comprises an OLED (organic light-emitting diode).

Also disclosed are methods of preparing articles. In some embodiments, the method of preparing an article comprises providing a substrate with a first major surface and a second major surface; providing a curable composition; disposing the curable composition on at least a portion of the second major surface of the substrate to form a curable layer; and curing the curable layer to form a cured organic layer. The cured organic layer comprises a crosslinked (meth)acrylate-based layer, and has a refractive index of 1.63 or greater at 532 nanometers, and is optically transparent, and has a thermal stability such that upon heating for 1 hour at 250° C. has a weight loss of 3.5% or less. In some embodiments, the refractive index is at least 1.64, 1.65, 1.66, 1.67, 1.68, 1.69, or 1.70. In some embodiments, the cured organic layer is optically clear.

A wide array of flexible and non-flexible substrates are suitable for use in the methods of this disclosure. For example, the substrate may be glass or a relatively thick layer of a polymeric material such as PMMA (polymethyl methacrylate) or PC (polycarbonate). Alternatively, the substrate may be a flexible polymeric film, such as films of PET (polyethylene terephthalate), PEN (polyethylene naphthalate), PC (polycarbonate), polyimide, PEEK (polyetherether ketone), and the like.

The curable compositions have been described above. The curable composition comprises an acrylate of Formula I;

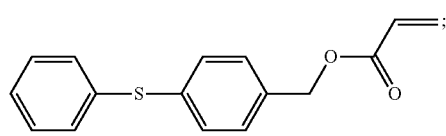

Formula I at least one multifunctional (meth)acrylate with fused aromatic groups, heteroarylene groups, heteroalkylene groups, alkylene groups, or aralkylene groups; and a photoinitiator.

The curable composition can be disposed on the second major surface of the substrate through a wide range of techniques. Methods of coating such as knife coating, gravure coating, air knife coating, slot die coating, and printing can be suitable. Printing techniques, such as screen printing and inkjet printing, are particularly suitable methods of disposing the curable composition on the second major surface of the substrate.

Curing of the curable composition layer can be effected by exposure of the curable composition layer to actinic radiation of the appropriate wavelength to activate the photoinitiator. Typically UV radiation is used, supplied by a UV lamp or light as is well known in the art. The type and dose of UV radiation used is dependent upon a number of factors such as the identity of the photoinitiator, the concentration of the photoinitiator, the thickness of the curable composition layer, and the like.

Typically, the cured organic layer is a relatively thin layer. Typically the cured organic layer is less than 1 mil thick (25 micrometers). In some embodiments, the cured organic layer has a thickness of from 1-16 micrometers.

The articles prepared from the methods of this disclosure can also include a wide range of additional substrates and layers. In some embodiments, the method further comprises depositing an inorganic barrier layer on the cured organic layer. In some embodiments, the method further comprises providing a device, and disposing the device on the second major surface of the substrate prior to disposing the curable composition on the second major surface of the substrate to form a curable layer. Among the particularly suitable devices are OLED devices.

EXAMPLES

Unless otherwise noted, all parts, percentages, ratios, etc. in the Examples and the rest of the specification are by weight. Unless otherwise indicated, all other reagents were obtained, or are available from fine chemical vendors such as Sigma-Aldrich Company, St. Louis, Missouri, or may be synthesized by known methods. Table 1 (below) lists materials used in the examples and their sources.

TABLE 1

| DESIGNATION | DESCRIPTION | SOURCE |
|---|---|---|
| PI-1 | Ethyl (2,4,6-trimethylbenzol) phenyl phosphinate obtained under the trade designation OMNIRAD TPO-L | IGM Resins, Charlotte, North Carolina |
| DEBPDA | (2,2'-Diethoxybiphenyl diacrylate (DEBPDA)) was prepared according to the procedure described in U.S. Pat. No. 9,383,482 | |
| DCM | Dichloromethane, $CH_2Cl_2$ | EMD Millipore a part of Merck KGaA, Darmstadt, Germany |
| THF | Tetrahydrofuran | EMD Millipore |
| TEA | Triethylamine | EMD Millipore |
| S1 | Para-(phenylthio) benzyl alcohol | Alfa Chemistry, Holtsville, NY |
| S2 | Hexane | EMD Millipore |
| S3 | Ethyl acetate | EMD Millipore |
| BHT | Inhibitor 2,6-Di-tert-butyl-4-methylphenol | Alfa Aesar, Haverhill, MA |
| 9H-Fluorene-9,9-dimethanol | 9H-Flourene-9,9-dimethanol | Millipore Sigma, St. Louis, MO |
| Acryloyl Chloride | Acryloyl Chloride | Millipore Sigma |
| DA-1 | Diacrylate-1, tricyclodecane dimethanol diacrylate commercially available as SR833S | Sartomer Americas, Exton, PA |

TABLE 1-continued

| DESIGNATION | DESCRIPTION | SOURCE |
| --- | --- | --- |
| TA-1 | Triacrylate-1, trimethylolpropane triacrylate, commercially available as SR351H | Sartomer Americas |
| TA-2 | Triacrylate-2, ethoxylated (3) trimethylolpropane triacrylate commercially available as SR454 | Sartomer Americas |
| DA-2 | Diacrylate-2, ([1,1'-binaphthalene]-2,2'-diylbis(oxy))bis(ethane-2,1-diyl)diacrylate obtained under the trade designation KAYARAD BNP-1 | Nippon Kayaku Co. Ltd. Tokyo, Japan |
| DA-3 | DSiacrylate-3, ethoxylated bisphenol fluorene diacrylate (BPEFDA) 60%/ o-Phenylphenol (EO) acrylate (OPPEA) 40% obtained under the trade designation KONOMER D0241 | KPX Green Chemical Co. Ltd, Seoul, Korea |

BPEFDA                OPPEA

Test Methods

Weight Loss Experiments (Outgassing) Test Method

Weight loss experiments were performed on a Discovery series (TA Instruments, New Castle, DE) thermogravimetric analyzer (TGA) under either air or nitrogen atmosphere. The samples were heated using a ramp rate of 10° C./minute from around room temperature (25° C.) to the specified temperature, followed by a 60 minute hold at the various temperatures (see Table 3).

Refractive Index Measurements of Liquids Test Method

Refractive index measurements of the liquid, uncured formulations were obtained using a Bausch and Lomb Abbe Refractometer (Bausch and Lomb, Rochester, NY).

Refractive Indices of Films of the Cured Formulations Test Method

Refractive indices of films of the cured formulations (optical coatings) were measured at 632.8 nanometers (nm), at 405 nm, and at 532 nm, using a Metricon 2010 Prism Coupler (Metricon Corporation Inc., Pennington, New Jersey). The optical coating to be measured was brought into contact with the base of a Rutile prism, leaving an air gap on the order of 0.1 micrometer.

Glass Transition (Tg) Measurement Test Method

The glass transition temperature (Tg) of the cured films was obtained using modulated differential scanning calorimetry on a Q2000 Series DSC from TA Instruments (New Castle, DE) using the following parameters: Equilibrate at −30.00° C., modulate+/−0.48° C. every 60 seconds, isothermal for 15.00 minutes, ramp at 3.00° C./minute to 150.00° C. The glass transition temperature was determined from the half-height of the transition.

General Procedure for Formulation Preparation

To a white polypropylene MAX 20 DAC cup (FlackTek Inc., Landrum SC) was added the appropriate amount of PI-1 photoinitiator followed by the appropriate amount of difunctional (meth)acrylate, and finally the appropriate amount of monofunctional (meth)acrylate Compound A (see Table 2). The mixture was hand stirred using a wooden application stick, followed by high shear mixing for 30 seconds at 1750 revolutions per minute (rpm) using a DAC 150 FVZ-K Speedmixer (FackTek Inc., Landrum SC).

General Procedure for Coating and Curing After mixing, each sample was deposited via pipet on a piece of silicone-treated PET release liner (Siliconature USA, Chicago, IL (SILPHAN S36 M 1R1003 CLEAR)). A second layer of PET release liner was laid on top of the ink, with the weight of the PET liner causing the formulation to spread. The material was cured under two 15 Watt GE F15T8BL black-light fluorescent bulbs for 30 seconds to gel the material, followed by an additional light exposure using a FUSION LIGHT HAMMER 10 equipped with a D-bulb (Heraeus Noblelight America, Gaithersburg, MD). Each formulation was passed four times under the Fusion D-bulb, at approximately 500 millijoules per centimeter squared (mJ/cm$^2$) per pass. Each sample was irradiated with two passes, and then the samples were flipped to irradiate from the opposite side for two passes under the Fusion D-bulb.

Example Preparation

Synthesis of para-thiophenyl benzyl acrylate (PTPBA)

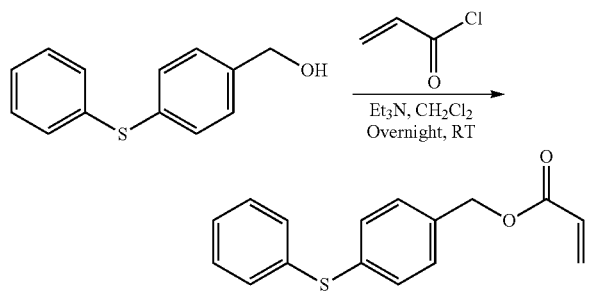

To a 2 liter (L) two necked round bottomed flask was added 100 grams (g) (0.463 mole (mol)) of para-(phenylthio)benzyl alcohol (S1) followed by addition of 350 milliliters (mL) of dichloromethane (DCM). The solution was stirred, and to it was added 77 mL (56 g, 0.5556 mol) of trimethylamine (TEA). The flask was then placed in an ice bath, and the solution was stirred under a nitrogen ($N_2$) atmosphere. 56.3 mL (62.7 g, 0.6944 mol) of acryloyl chloride in 100 mL dichloromethane (DCM) was added dropwise to the stirring solution (under ice bath) using an addition funnel, which was connected to a drying tube that contained DRIERITE (W A Hammond Drierite Co., LTD, Xenia, OH). After the addition was complete, the solution was warmed to room temperature, and stirred overnight under $N_2$ atmosphere at room temperature.

Completion of the reaction was assessed by thin-layer chromatography of the crude reaction using 5:1 S2:S3 as the mobile phase. The flask was placed in an ice bath, and the reaction was quenched using saturated sodium bicarbonate. Most of the DCM was evaporated using rotary evaporation. The crude solution was then taken in S3, and the organic part was extracted using water (2 times) and brine (once). The organic layer was dried over $MgSO_4$, filtered, and the solvent was evaporated to yield the crude product as a brown oil. Wiped film evaporation distillation (conditions: 140° C. jacket, 22 mTorr vacuum, 10° C. condenser low flow) followed by column chromatography (5:1 S2:S3 as the mobile phase) of the crude product gave 76 g of the pure product as a colorless oil. BHT inhibitor (7 milligrams (mg)) was added into the final acrylate. $^1H$ NMR (500 MHz, $CDCl_3$): 7.24-7.4 (9H, m), 6.44 (1H, m), 6.15 (1H, m), 5.84 (1H, m), 5.16 (2H, s). $^{13}C$ NMR (125 MHz, CDCl3): δ=166.9, 136.4, 135.0, 134.5, 131.5, 131.3, 130.6, 129.3, 129, 128.1, 127.4, 65.8.

Synthesis of 9,9-Bis[(Acryloyloxy)Methyl]Fluorine (FDA)

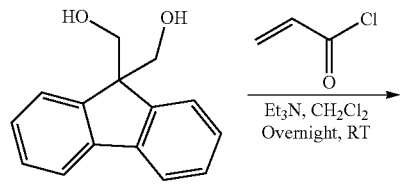

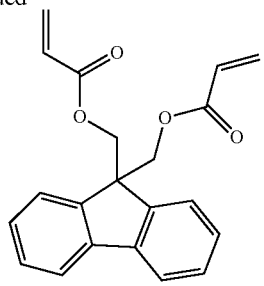

To a 500 mL two necked round bottomed flask was added 9H-Fluorene-9,9-dimethanol (8 g, 35.4 mmol) followed by addition of 85 mL of dichloromethane (DCM). The solution was stirred, and to it was added triethylamine (8.6 g, 22 mmol). The flask was then placed in an ice bath, and the solution was stirred under a $N_2$ atmosphere. Acryloyl chloride (9.55 g, 106 millimole (mmol)) in 20 mL dichloromethane was added dropwise to the stirring solution (under ice bath) using an addition funnel, which was connected to a drying tube that contained DRIERITE. After the addition was complete, the solution was warmed to room temperature, and stirred overnight under $N_2$ atmosphere at room temperature.

Reaction conversion was assessed by thin layer chromatography (TLC) of the crude reaction using 5:1 (v/v) hexane:ethyl acetate as the mobile phase. The flask was placed in an ice bath, and the reaction was quenched using saturated $NaHCO_3$. Bis(1-oxyl-2,2,6,6-tetramethylpiperidin-4-yl) isophthalate (approximately 5 mg) (can be prepared according to Example 14 in U.S. Pat. No. 5,574,163) was added and most of the DCM was evaporated using rotary evaporation. The crude solution was then taken in ethyl acetate, and the organic part was extracted using water (twice using 25 mL) and brine (25 mL). The organic layer was dried over $MgSO_4$, filtered, and the solvent was evaporated to yield the crude product as a brown oil. Column chromatography (5:1 hexane:ethyl acetate as the mobile phase) of the crude product gave 7.4 g (63%) of the product as a light yellow oil. BHT (inhibitor) (7 mg) was added into the final product. $^1H$ NMR (500 MHZ, $CDCl_3$): δ=7.69-7.84 (2H, m), 7.60-7.62 (2H, m), 7.42-7.46 (2H, m), 7.31-7.34 (2H, m), 6.39-6.43 (2H, m), 6.14-6.20 (2H, m), 5.86-5.89 (2H, m), 4.48 (4H, s). $^{13}C$ NMR (125 MHz, $CDCl_3$): δ=165.8, 144.4, 140.8, 131.4, 128.7, 128.0, 127.4, 125.0, 120.3, 65.9, 52.9.

Synthesis of (2-propenoic acid, 1,1'-(thiodi-4,1-phenylene) ester) (BAPS)

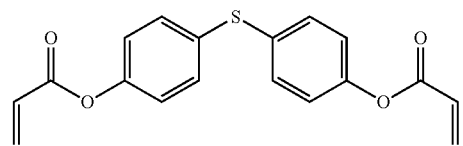 [SMILES: C=CC(=O)Oc1ccc(Sc2ccc(OC(=O)C=C)cc2)cc1]

4-(4-hydroxyphenyl)sulfanylphenol (Millipore Sigma, St. Louis, MO) (150 g, 687 mmol) was dissolved in 1000 mL tetrahydrofuran (THF), along with 2.2 equivalents triethylamine (153 g) and 0.005 equivalents dimethylaminopyridine (Millipore Sigma, St. Louis, MO) (0.424 g). The solution was cooled to 0° C. on an ice bath and 2.16 equivalents acryloyl chloride (Millipore Sigma, St. Louis, MO) (133 g)

was added slowly to maintain a temperature below 15° C. After addition was complete the reaction was allowed to come to room temperature overnight. THF was removed via rotary evaporation, and the resulting solids washed with water and ethyl acetate. The organic phase was collected and dried over MgSO$_4$, then filtered and solvent removed. A final purification was performed via rolled film evaporation at the following conditions: Crude product held at 85° C. to feed to an evaporator with jacket at 150° C., condenser at 85° C., and vacuum at 5 mTorr. The product is a white solid at room temperature. $^1$H NMR (300 MHz, CDCl$_3$) δ=7.37 (4H, m), 7.10 (4H, m), 6.6 (2H, dd), 6.3 (2H, dd), 6.0 (2H, dd).

Synthesis of 1,3,4-thiadiazole-2,5-diyl)bis(sulfanediyl)bis(ethane-2,1-diyl) diacrylate (TDZDA)

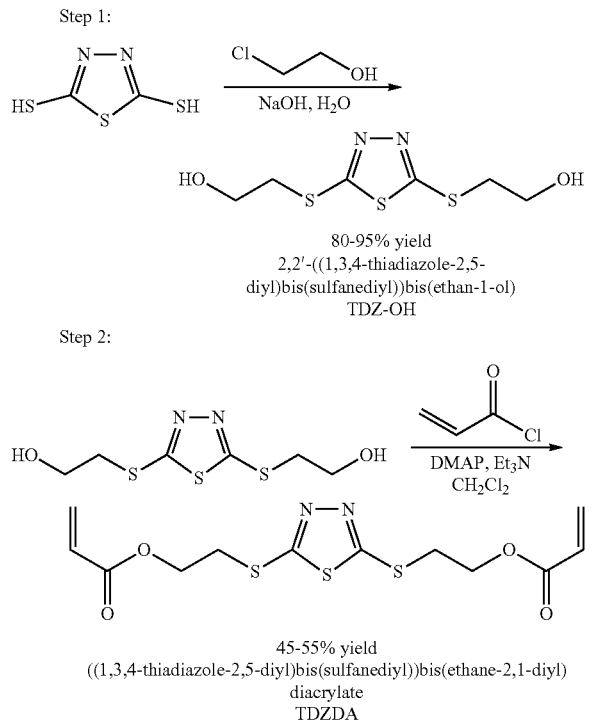

Step 1: Synthesis of 2,2'-((1,3,4-thiadiazole-2,5-diyl)bis(sulfanediyl))bis(ethan-1-ol) (TDZ-OH)

Sodium hydroxide (21.0 g, 525 mmol) was placed in a round bottom flask with a stir bar and dissolved in water (80 mL). 1,3,4-Thiadiazole-2,5-dithiol (Millipore Sigma, St. Louis, MO) (38.6 g, 257 mmol) was added slowly and the mixture stirred for 1 hour until the solution became homogeneous. After such time, 2-chloroethanol (Millipore Sigma, St. Louis, MO) (40 mL, 600 mmol) was added dropwise. The mixture was heated to 60° C. for 2 hours and then allowed to cool to room temperature. The product precipitated from solution and was filtered and dried in a vacuum oven (60° C., 1 torr) overnight. A white, crystalline solid was obtained (53.2 g, 87% yield).

Step 2: Synthesis of 1,3,4-thiadiazole-2,5-diyl)bis(sulfanediyl)bis(ethane-2,1-diyl) diacrylate (TDZDA)

Into a flame dried 2-neck flask equipped with a stir bar and addition funnel, was placed TDZ-OH (50.0 g, 210 mmol). Dichloromethane (DCM) (400 mL) was added along with 4-dimethylaminopyridine (2.56 g, 20.7 mmol) and trimethylamine (TEA) (80 mL, 574 mmol). The system was flushed with N$_2$ and a mixture of acryloyl chloride (65 mL, 799 mmol) and dichloromethane (DCM) (100 mL) was added to the addition funnel. The reaction flask was cooled to 0° C. with an ice bath and the acryloyl chloride/CH$_2$Cl$_2$ mixture was added slowly, dropwise over several hours. The reaction mixture was stirred overnight, warming to room temperature. After such time, the mixture was cooled to 0° C. and then quenched with methanol (20 mL), followed by a saturated aqueous solution of sodium bicarbonate. The organic layer was separated from the aqueous layer and washed with water, followed by brine, dried over MgSO$_4$, filtered and concentrated. The viscous oil obtained was purified by automated flash chromatography (Biotage Isolera) with S2/S3 and a pale-yellow liquid was isolated (41.1 g, 57% yield).

Synthesis of 4,4'-bis[(acryloyloxyethylthio)diphenylsulfide] (BADS)

BADS was synthesized according to the method described in You et al., Journal of Polymer Science: Part A: Polymer Chemistry, Vol. 48, 2604-2609 (2010).

TABLE 2

Formulation Details for Curable Compositions

| Example | Monofunctional Component (A) | Multifunctional Component (B) | A:B | Monofunctional (A) Weight (g) | Multifunctional (B) Weight (g) | PI-1 Weight (g) |
|---|---|---|---|---|---|---|
| EX-1 | p-TPBA | DA-1 | 90:10 | 4.5090 | 0.5030 | 0.035 |
| EX-2 | p-TPBA | BADS | 95:5 | 4.7658 | 0.2635 | 0.0356 |
| EX-3 | p-TPBA | DA-1 | 95:5 | 4.7494 | 0.2616 | 0.0352 |
| EX-4 | p-TPBA | DEBPDA | 95:5 | 4.7472 | 0.2535 | 0.0357 |
| EX-5 | p-TPBA | BADS | 90:10 | 4.5447 | 0.5133 | 0.0350 |
| EX-6 | p-TPBA | DEBPDA | 90:10 | 4.5085 | 0.5299 | 0.0352 |
| EX-7 | p-TPBA | DA-2 | 95:5 | 9.51 | 0.49 | 0.0697 |
| EX-8 | p-TPBA | DA-2 | 90:10 | 4.5058 | 0.5557 | 0.035 |
| EX-9 | p-TPBA | HR6100 | 95:5 | 4.7534 | 0.2779 | 0.0348 |
| EX-10 | p-TPBA | MRD-15 | 90:10 | 4.5051 | 0.5086 | 0.0348 |
| EX-11 | p-TPBA | FDA | 95:5 | 9.5 | 0.53 | 0.0700 |
| EX-12 | p-TPBA | DA-3 | 95:5 | 4.7544 | 0.2700 | 0.0364 |
| EX-13 | p-TPBA | TA-1 | 95:5 | 4.7627 | 0.2659 | 0.0359 |
| EX-14 | p-TPBA | TA-1 | 90:10 | 4.5128 | 0.5104 | 0.0356 |

TABLE 2-continued

Formulation Details for Curable Compositions

| Example | Monofunctional Component (A) | Multifunctional Component (B) | A:B | Monofunctional (A) Weight (g) | Multifunctional (B) Weight (g) | PI-1 Weight (g) |
|---|---|---|---|---|---|---|
| EX-15 | p-TPBA | TA-2 | 95:5 | 4.7884 | 0.2466 | 0.0349 |
| EX-16 | p-TPBA | TA-2 | 90:10 | 4.5048 | 0.5058 | 0.0356 |
| CE-1 | M1122 | DA-2 | 90:10 | 4.5811 | 0.5538 | 0.0356 |
| CE-2 | p-TPBA | TDZDA | 95:5 | 4.4745 | 0.2543 | 0.0250 |
| CE-3 | p-TPBA | TDZDA | 95:5 | 4.7463 | 0.2448 | 0.0199 |
| CE-4 | p-TPBA | TDZ-UDMA | 95:5 | 4.7673 | 0.3011 | 0.0352 |
| CE-5 | p-TPBA | TDZDA | 90:10 | 4.4974 | 0.5241 | 0.0353 |
| CE-6 | M1192H | DA-1 | 90:10 | 4.5902 | 0.5232 | 0.0352 |
| CE-7 | M1192H | BADS | 90:10 | 4.5298 | 0.5031 | 0.0356 |

TABLE 3

Properties of Cured Formulations

| Sample | Uncured RI | Film RI 405 nm | Film RI 532 nm | 632.8 nm | Tg (° C.) | Outgassing (% Weight Loss) 200° C. ($N_2$) | 250° C. ($N_2$) | 275° C. ($N_2$) | 300° C. ($N_2$) | 200° C. (air) |
|---|---|---|---|---|---|---|---|---|---|---|
| EX-1 | 1.595 | 1.679 | 1.642 | 1.629 | 27.44 | 2.082 | 2.328 | 3.099 | 7.579 | 2.325 |
| EX-2 | 1.606 | 1.695 | 1.652 | 1.638 | 20.51 | 2.144 | 2.381 | 3.881 | 11.010 | 2.378 |
| EX-3 | 1.600 | 1.684 | 1.645 | 1.632 | 22.08 | 2.229 | 2.502 | 3.392 | 9.080 | 2.418 |
| EX-4 | 1.603 | 1.689 | 1.649 | 1.635 | 22.35 | 2.196 | 2.506 | 3.790 | 10.430 | 2.338 |
| EX-5 | 1.607 | 1.695 | 1.653 | 1.639 | 22.17 | 2.122 | 2.516 | 3.977 | 10.200 | 2.318 |
| EX-6 | 1.601 | 1.686 | 1.647 | 1.633 | 26.73 | 2.151 | 2.540 | 3.696 | 9.881 | 2.272 |
| EX-7 | 1.607 | 1.691 | 1.650 | 1.636 | 21.85 | 1.845 | 2.606 | 4.944 | 12.070 | 2.003 |
| EX-8 | 1.609 | 1.693 | 1.651 | 1.637 | 21.36 | 2.199 | 2.612 | 3.490 | 9.164 | 2.364 |
| EX-9 | 1.603 | 1.686 | 1.646 | 1.632 | 17.35 | 2.355 | 2.642 | 3.728 | 9.120 | 2.488 |
| EX-10 | 1.605 | 1.693 | 1.652 | 1.638 | 28.88 | 2.426 | 2.781 | 4.450 | 20.940 | 2.135 |
| EX-11 | 1.604 | 1.691 | 1.649 | 1.635 | 23.61 | 1.794 | 3.037 | 4.918 | 11.740 | 1.888 |
| EX-12 | 1.605 | 1.690 | 1.649 | 1.635 | 19.66 | 2.431 | 3.112 | 4.294 | 10.680 | 2.661 |
| EX-13 | 1.598 | 1.685 | 1.645 | 1.632 | 23.66 | 1.488 | 1.707 | 2.616 | 7.617 | 1.583 |
| EX-14 | 1.592 | 1.678 | 1.640 | 1.627 | 27.70 | 1.345 | 1.729 | 2.571 | 6.790 | 1.716 |
| EX-15 | 1.598 | 1.683 | 1.644 | 1.631 | 20.68 | 1.531 | 1.795 | 1.403 | 6.963 | 1.827 |
| EX-16 | 1.591 | 1.675 | 1.637 | 1.625 | 23.89 | 1.448 | 1.685 | 2.371 | 6.939 | 1.553 |
| CE-1 | 1.575 | 1.643 | 1.611 | 1.600 | 13.64 | 2.450 | 3.591 | 5.052 | 9.824 | 2.825 |
| CE-2 | 1.604 | 1.691 | 1.650 | 1.636 | 19.74 | 2.427 | 4.396 | 9.953 | 19.900 | 2.583 |
| CE-3 | 1.604 | 1.691 | 1.650 | 1.636 | 19.48 | 2.470 | 4.546 | 9.264 | 19.010 | 2.675 |
| CE-4 | 1.603 | 1.687 | 1.645 | 1.631 | 20.63 | 2.484 | 6.379 | 9.974 | 16.600 | 2.750 |
| CE-5 | 1.603 | 1.689 | 1.649 | 1.636 | 22.70 | 2.636 | 6.515 | 16.210 | 29.870 | 2.732 |
| CE-6 | 1.589 | 1.671 | 1.632 | 1.620 | 34.69 | 6.201 | 10.920 | 13.610 | 17.490 | 9.226 |
| CE-7 | 1.600 | 1.687 | 1.645 | 1.631 | 29.13 | 5.195 | 11.480 | 13.420 | 19.760 | 8.154 |

What is claimed is:

1. A curable composition comprising:
an acrylate of Formula I;

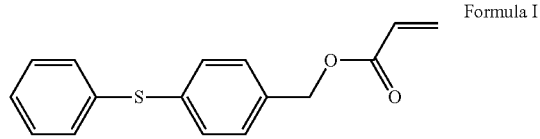

Formula I at least one multifunctional (meth)acrylate with fused aromatic groups, heteroarylene groups, heteroalkylene groups, alkylene groups, or aralkylene groups; and
a photoinitiator;
wherein the composition when cured has a refractive index of 1.63 or greater at 532 nanometers, is optically transparent, and has a thermal stability such that upon heating for 1 hour at 250° C. has a weight loss of 3.5% or less.

2. The curable composition of claim 1, wherein the aromatic acrylate of Formula I comprises greater than 50% by weight of the curable composition.

3. The curable composition of claim 1, wherein the at least one multifunctional (meth)acrylate with fused aromatic groups, heteroarylene groups, heteroalkylene groups, alkylene groups, or aralkylene groups comprises 10% by weight or less of the curable composition.

4. The curable composition of claim 1, wherein the at least one multifunctional (meth)acrylate comprises a compound of Formula II:

$$H_2C=CR_2-(CO)-O-A-O-(CO)-R2C=CH_2 \quad \text{Formula II}$$

wherein R2 is hydrogen or methyl;
(CO) is a carbonyl group C=O; and
A is a divalent group comprising fused aromatic groups, heteroarylene groups, heteroalkylene groups, alkylene groups, or aralkylene groups.

5. The curable composition of claim 4, wherein A is a divalent group comprising:
a fused aromatic group selected from a fluorenyl group, or a group with the structure:

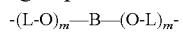

wherein B is a phenyl-substituted fluorenyl group, an alkylene-substituted fluorenyl group, a naphthalene group, or an —Ar—Ar— group, wherein each Ar group is a naphthalene group;
L is an alkylene group comprising 2-12 carbon atoms; and
m is an integer ranging from 1-10.

6. The curable composition of claim 5, wherein the at least one multifunctional (meth)acrylate comprises a compound with the structure of Formula III, IV, or V:

Formula III

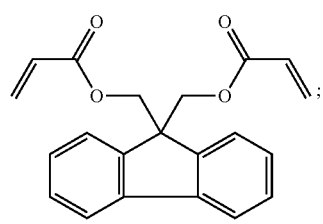

Formula IV

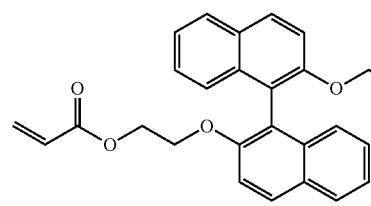
; and

Formula V

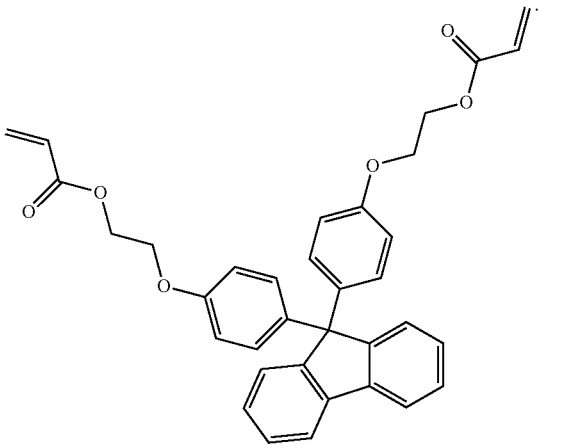

7. The curable composition of claim 1, wherein the at least one multifunctional (meth)acrylate comprises a compound of Formula IIA:

Formula IIA

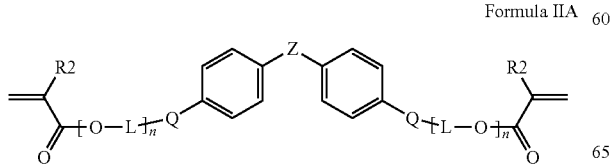

wherein each R2 is independently hydrogen or methyl;
Z is S, or a single bond;
each Q is independently O or S;
L is an alkylene group comprising 2-12 carbon atoms; and
n is an integer ranging from 0 to 10.

8. The curable composition of claim 7, wherein the at least one multifunctional (meth)acrylate comprises a compound with the structure of Formula VI, VII, or VIII:

Formula VI

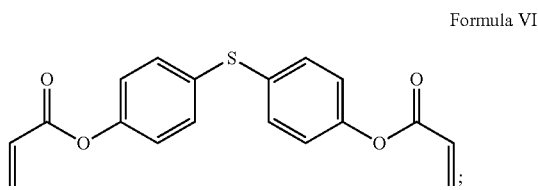

Formula VII

; and

Formula VIII

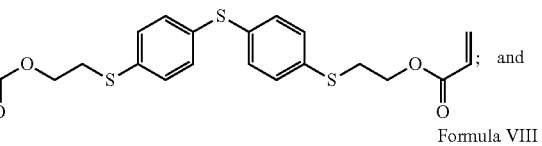

9. The curable composition of claim 1, wherein the composition upon curing is optically clear.

10. An article comprising:
a substrate with a first major surface and a second major surface;
a cured organic layer adjacent to at least a portion of the second major surface of the substrate, wherein the cured organic layer comprises a crosslinked (meth)acrylate-based layer, and has a refractive index of 1.63 or greater at 532 nanometers, and is optically transparent, and has a thermal stability such that upon heating for 1 hour at 250° C. has a weight loss of 3.5% or less.

11. The article of claim 10, further comprising an inorganic barrier layer in contact with the cured organic layer.

12. The article of claim 10, wherein the cured organic layer comprises a curable composition that has been disposed and cured on at least a portion of the second major surface of the substrate,
wherein the curable composition comprises:
an acrylate of Formula I;

Formula I

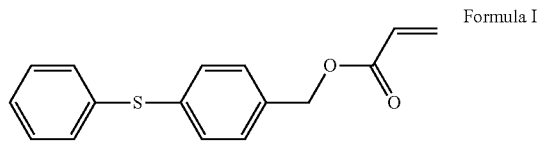 [SMILES: C=CC(=O)OCc1ccc(Sc2ccccc2)cc1]

at least one multifunctional (meth)acrylate with fused aromatic groups, heteroarylene groups, heteroalkylene groups, alkylene groups, or aralkylene groups; and
a photoinitiator.

13. The article of claim 10, wherein the cured organic layer has a thickness of from 1-16 micrometers.

14. The article of claim 10, wherein the article further comprises a device disposed on the second major surface of the substrate, and adjacent to the cured organic layer.

15. The article of claim 14, wherein the device comprises an OLED (organic light-emitting diode).

16. A method of preparing an article comprising:
providing a substrate with a first major surface and a second major surface;
providing a curable composition wherein the curable composition comprises:
an acrylate of Formula I;

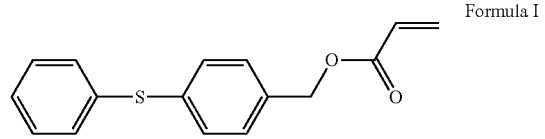 [SMILES: C=CC(=O)OCc1ccc(Sc2ccccc2)cc1]

Formula I at least one multifunctional (meth)acrylate with fused aromatic groups, heteroarylene groups, heteroalkylene groups, alkylene groups, or aralkylene groups; and
a photoinitiator;
wherein the curable composition when disposed and cured has a refractive index of 1.63 or greater at 532 nanometers, is optically transparent, and has a thermal stability such that upon heating for 1 hour at 250° C. has a weight loss of 3.5% or less;
disposing the curable composition on at least a portion of the second major surface of the substrate to form a curable layer;
curing the curable layer to form a cured organic layer.

17. The method of claim 16, further comprising depositing an inorganic barrier layer on the cured organic layer.

18. The method of claim 16, wherein disposing of the curable composition on the second major surface of the substrate to form a curable layer comprises coating to a thickness of from 1-16 micrometers.

19. The method of claim 16, further comprising providing a device; and
disposing the device on the second major surface of the substrate prior to disposing the curable composition on the second major surface of the substrate to form a curable layer.

* * * * *